United States Patent
Malmlöf et al.

(10) Patent No.: US 11,774,483 B2
(45) Date of Patent: Oct. 3, 2023

(54) OVER THE AIR MEASUREMENTS MEETING A GAIN FLATNESS CRITERION

(71) Applicants: BLUETEST AB, Gothenburg (SE); GEFLE TESTTEKNIK AB, Gävle (SE)

(72) Inventors: Peder Malmlöf, Gävle (SE); Robert Rehammar, Romelanda (SE)

(73) Assignees: BLUETEST AB, Gothenburg (SE); GEFLE TESTTEKNIK AB, Gävle (SE)

( * ) Notice: Subject to any disclaimer, the term of this patent is extended or adjusted under 35 U.S.C. 154(b) by 31 days.

(21) Appl. No.: 17/609,666

(22) PCT Filed: Apr. 29, 2020

(86) PCT No.: PCT/EP2020/061909
§ 371 (c)(1),
(2) Date: Nov. 8, 2021

(87) PCT Pub. No.: WO2020/229187
PCT Pub. Date: Nov. 19, 2020

(65) Prior Publication Data
US 2022/0196717 A1    Jun. 23, 2022

(30) Foreign Application Priority Data

May 10, 2019  (SE) .................................. 1930150-6

(51) Int. Cl.
*G01R 27/04*  (2006.01)
*G01R 29/10*  (2006.01)
(Continued)

(52) U.S. Cl.
CPC ........... *G01R 29/105* (2013.01); *H04B 17/29* (2015.01); *H04B 17/3911* (2015.01); *H04L 1/203* (2013.01)

(58) Field of Classification Search
CPC ............ G01R 29/0821; G01R 29/0864; G01R 29/0871; G01R 29/0892; G01R 29/105;
(Continued)

(56) References Cited

U.S. PATENT DOCUMENTS

| | | |
|---|---|---|
| 2003/0184417 A1 | 10/2003 | Li et al. |
| 2010/0099361 A1* | 4/2010 | Lundstrom ........ H04B 17/3912 455/67.11 |

(Continued)

FOREIGN PATENT DOCUMENTS

| | | |
|---|---|---|
| JP | 2010-156572 | 7/2010 |
| WO | 2008/127158 | 10/2008 |
| WO | 2018/164627 | 9/2018 |

OTHER PUBLICATIONS

Search Report for SE Patent Application No. 1930150-6 dated Dec. 6, 2019, 2 pages.
(Continued)

*Primary Examiner* — Thang X Le
(74) *Attorney, Agent, or Firm* — NIXON & VANDERHYE

(57) ABSTRACT

A method for measuring performance of at least one DUT in a reverberation chamber over a frequency band, the method including, iteratively: generating a fading scenario by the reverberation chamber; identifying at least one measurement sub-band included in the frequency band, wherein the at least one measurement sub-band complies with a gain flatness criterion; measuring performance of the at least one DUT in the at least one identified measurement sub-band, thereby generating at least one performance measurement result; accumulating the at least one performance measurement result; and determining measurement coverage and terminating the performance measurement in case the measurement coverage meets a coverage criterion.

16 Claims, 4 Drawing Sheets

(51) Int. Cl.
*H04B 17/29* (2015.01)
*H04B 17/391* (2015.01)
*H04L 1/20* (2006.01)

(58) Field of Classification Search
CPC . G01R 31/302; G01R 31/308; G01R 31/3171
See application file for complete search history.

(56) References Cited

U.S. PATENT DOCUMENTS

| | | | | |
|---|---|---|---|---|
| 2010/0329319 | A1* | 12/2010 | Dai | G01R 31/3171 375/224 |
| 2013/0234741 | A1* | 9/2013 | Mow | H01Q 5/328 324/750.01 |
| 2014/0141727 | A1 | 5/2014 | Kildal et al. | |
| 2015/0054696 | A1* | 2/2015 | Werner | H01Q 1/273 343/718 |
| 2017/0311307 | A1* | 10/2017 | Negus | H01Q 21/24 |
| 2018/0337738 | A1 | 11/2018 | Wen et al. | |
| 2020/0341044 | A1* | 10/2020 | Kvarnstrand | G01R 29/0871 |

OTHER PUBLICATIONS

International Search Report for PCT/EP2020/061909 dated Jul. 20, 2020, 4 pages.
Written Opinion of the ISA for PCT/EP2020/061909 dated Jul. 20, 2020, 8 pages.
"Universal Mobile Telecommunications Systems (UMTS), LTE, Measurement of radiated performance for Multiple Input Multiple Output (MIMO) and multi-antenna reception for High Speed Packet Access (HSPA) and LTE terminals (3GPP TR 37.976 version 14.0.0 Release 14)", ETSI Techincal Report, European Telecommunications Standards Institute (ETSI), 650, Route Des Lucioles, F-06921, Sophia-Antiplois, France, Apr. 2017, 76 pages.
Foegelle Michael D, "New and Continuing Measurement Challenges for 5G mmWave and Beamforming Technologies", 2019 13$^{th}$ European Conference on Antennas and Propagation (EUCAP), European Association on Antennas and Propagation, Cedar Park, TX, Mar. 31, 2019, pp. 1-5.
Remley et al., "Configuring and Verifying Reverberation Chambers for Testing Cellular Wireless Devices", IEEE Transactions on Electromagnetic Compatibility, IEEE Service Center, vol. 58, No. 3, Jun. 1, 2016, New York, NY, pp. 661-672.

* cited by examiner

OVER THE AIR MEASUREMENTS MEETING A GAIN FLATNESS CRITERION

This application is the U.S. national phase of International Application No. PCT/EP2020/061909 filed Apr. 29, 2020 which designated the U.S. and claims priority to SE Patent Application No. 1930150-6 filed May 10, 2019, the entire contents of each of which are hereby incorporated by reference.

TECHNICAL FIELD

The present disclosure relates to test equipment for antenna arrangements and wireless devices in general. There are also disclosed systems and methods for measuring the performance of antenna systems and for testing wireless devices.

BACKGROUND

Reverberation Chambers (RC), also known as electromagnetic reverberation chambers (ERC) or mode-stirred chambers (MSC) have become effective tools for measuring Over-the-Air (OTA) performance of various wireless devices. RCs are mainly used for evaluating antenna system performance in radio frequency reflective environments, i.e., when the device under test (DUT) is subjected to multipath propagation.

In an RC, the signal is injected or picked up by a test antenna arrangement in a closed chamber, or cavity, comprising inwardly radio frequency reflective walls. An injected signal arrives at the DUT after multiple reflections through many different trajectories. This creates a radio frequency signal fading state at the receiver. By moving mode stirring plates and/or a turntable upon which the DUT is arranged, the geometry of the chamber changes, which in turn changes the fading state that the DUT experiences. Thus, a rich isotropic multipath (RIMP) environment is efficiently generated where a large number of fading states with different incident wave compositions can be tested in an efficient manner.

However, the RIMP environment affects the results of certain types of measurements, like measurements of error vector magnitude (EVM), which are normally conducted in more anechoic environments. EVM measurements are therefore normally performed using conducted measurements where a cable is used to transfer the test signal between the DUT and the measurement equipment.

3GPP TS 36.104 V16.1.0 discusses EVM measurements in Section 6.5.2 and in Annex E.

SUMMARY

It is an object of the present disclosure to provide techniques for measuring performance of at least one DUT in a reverberation chamber or similar measurement equipment.

This object is obtained by a method for measuring performance of at least one DUT in a reverberation chamber over a frequency band. The method comprises, iteratively, generating a fading scenario by the reverberation chamber, and identifying at least one measurement sub-band comprised in the frequency band, wherein the at least one measurement sub-band complies with a gain flatness criterion. The method also comprises measuring performance of the at least one DUT in the at least one identified measurement sub-band, thereby generating at least one performance measurement result, and accumulating the at least one performance measurement result. The method then determines measurement coverage and terminates the performance measurement in case the measurement coverage meets a coverage criterion.

This way it becomes possible to measure performance of a DUT in a frequency selective radio propagation environment almost as if the measurement had been made in a flat fading environment, which is an advantage.

Another advantage is that different types of measurements, e.g., Electromagnetic compatibility (EMC) and electromagnetic interference (EMI) measurements can be made in batch mode together with measurements which are normally not made in a reverberation chamber, such as measurements of EVM.

According to aspects, generating a fading scenario comprises selecting a loading of the reverberation chamber, and/or selecting a coherence bandwidth of the reverberation chamber. Loading and coherence bandwidth influence how frequency selective the radio propagation environment inside the RC is. Thus, advantageously, the measurement equipment disclosed herein can be adapted for different propagation scenarios having different levels of frequency selectivity.

According to aspects, the gain flatness criterion comprises a measure of gain difference across the measurement sub-band. This is a versatile flatness criterion which can be adapted to different measurement needs, which is an advantage. The flatness criterion may be selected as a trade-off between measurement accuracy and measurement time, which is an advantage.

According to aspects, a plurality of measurement sub-bands can be identified in each iteration. This shortens measurement time and/or increases measurement accuracy, which is an advantage.

According to aspects, a measurement sub-band is identified only if the measurement sub-band spans over a minimum number of resource blocks and/or only if the measurement sub-band spans over a minimum frequency range. By requiring the sub-band to span over a minimum number of resource blocks, and/or requiring the sub-band to span over a minimum frequency range, spurious effects and transient behaviors are avoided in the measurement results, leading to increased measurement accuracy.

According to aspects, the measured performance comprises an error vector magnitude, EVM, measurement. Thus, advantageously, measurements specified in, e.g., 3GPP TS 36.104 V16.1.0 Section 6.5.2 and Annex E can be performed, which is an advantage since Long Term Evolution (LTE) and new radio (NR) system can be characterized in terms of performance by the disclosed techniques.

According to aspects, the performance measurement is part of an automated set of measurements. This provides both operator convenience and increases measurement efficiency, which is an advantage.

According to aspects, the measurement coverage is determined based on frequency range coverage. Sufficient frequency coverage often correlates with reliable measurement results, which means that the iterative method can be reliably terminated by a reliable termination mechanism, which is an advantage. Also, a trade-off can be made between measurement accuracy and measurement time by adjusting the target coverage, which is an advantage.

According to aspects, the measurement coverage is determined based on estimated measurement accuracy. Consequently, the method is not terminated until a sufficient accuracy has been obtained, leading to reliable measurement results, which is an advantage.

There are furthermore disclosed herein control units, computer programs and measurement devices associated with the same advantages as discussed above in connection to the different methods.

Generally, all terms used in the claims are to be interpreted according to their ordinary meaning in the technical field, unless explicitly defined otherwise herein. All references to "a/an/the element, apparatus, component, means, step, etc." are to be interpreted openly as referring to at least one instance of the element, apparatus, component, means, step, etc., unless explicitly stated otherwise. The steps of any method disclosed herein do not have to be performed in the exact order disclosed, unless explicitly stated. Further features of, and advantages with, the present invention will become apparent when studying the appended claims and the following description. The skilled person realizes that different features of the present invention may be combined to create embodiments other than those described in the following, without departing from the scope of the present invention.

BRIEF DESCRIPTION OF THE DRAWINGS

The present disclosure will now be described in more detail with reference to the appended drawings, where FIG. 1 schematically illustrates an example measurement device for measuring performance of a wireless device under test.

DETAILED DESCRIPTION

Figure 1:
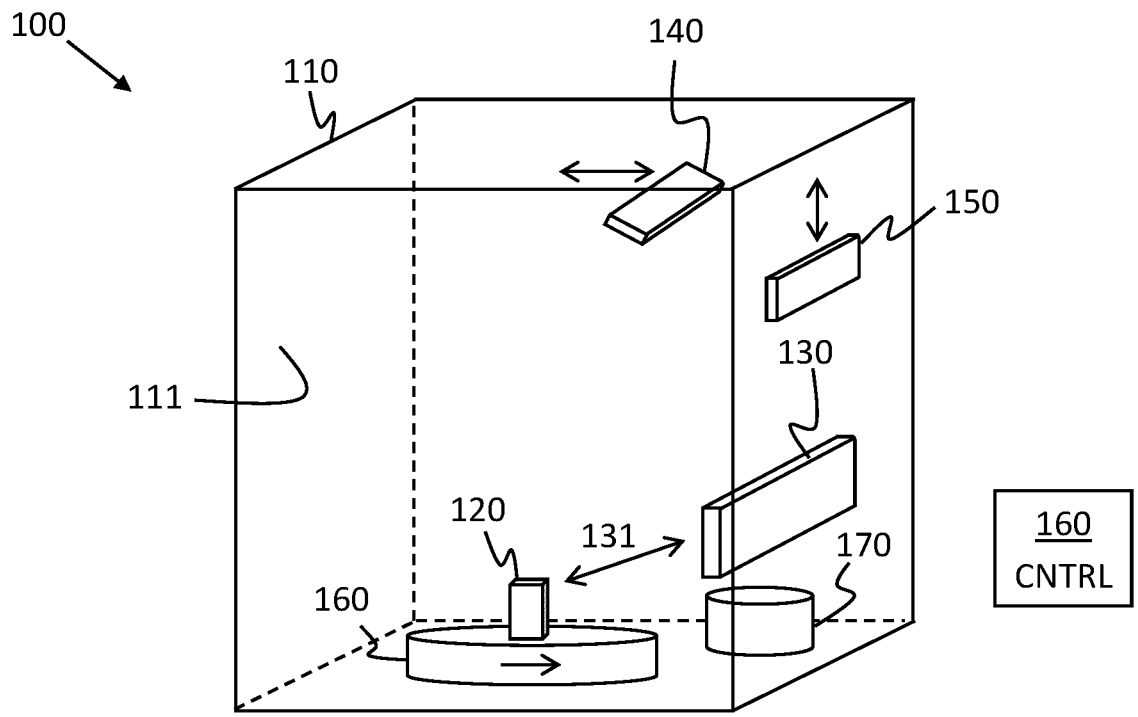

Aspects of the present disclosure will now be described more fully with reference to the accompanying drawings. The different devices and methods disclosed herein can, however, be realized in many different forms and should not be construed as being limited to the aspects set forth herein. Like numbers in the drawings refer to like elements throughout.

The terminology used herein is for describing aspects of the disclosure only and is not intended to limit the invention. As used herein, the singular forms "a", "an" and "the" are intended to include the plural forms as well, unless the context clearly indicates otherwise.

Reverberation Chambers (RCs), as mentioned above, provide a straightforward solution to testing wireless systems in multipath propagation scenarios. RCs are especially suitable for testing of devices that rely on multipath signal propagation to and from multiple antennas at transmitter and receiver for communication, known as Multiple Input Multiple Output (MIMO) and for devices that simultaneously operate using several frequency bands.

It is appreciated that test signals can be injected either by the device under test (DUT), or by test antenna arrangements of the RC. Thus, RCs can be used for measuring both transmit side (TX) and receive side (RX) DUT radio operation, or both at the same time. Also, since both TX and RX DUT operation can be measured, a 3GPP uplink specification can be tested against as well as a 3GPP downlink specification.

Anechoic Chambers (ACs) have a long history as test solution for radio communication devices. An AC is a chamber or cavity enclosed by radio signal absorbing material. Its most prominent feature is that it will have a very low level of reflected signals, i.e., the opposite of the RC. ACs are commonly used when measuring over-the-air (OTA) performance where a device under test is subjected to a radio signal incident from a single direction of arrival.

Conducted measurements are measurements where the DUT is connected to the measurement equipment directly via cable, i.e., there is no wireless signal propagation between the DUT and the measurement equipment.

FIG. 1 schematically illustrates a measurement device 100 for measuring performance of at least one DUT 120 in a frequency band.

Herein, the performance of the DUT 120 is measured at least partly in terms of error vector magnitude (EVM) unless otherwise noted. EVM, which is sometimes also called relative constellation error (RCE), is a measure used to quantify the performance of a digital radio transmitter or receiver. A signal sent by an ideal transmitter or received by a receiver would have all constellation points precisely at the ideal locations, however various imperfections in the implementation (such as thermal noise, carrier leakage, low image rejection ratio, phase noise etc.) cause the actual constellation points to deviate from the ideal locations. Informally, EVM is a measure of how far the points are from the ideal locations.

Noise, distortion, spurious signals, and phase noise all degrade EVM, and therefore EVM provides a comprehensive measure of the quality of the radio receiver or transmitter for use in digital communications. 3GPP TS 36.104 V16.1.0 discusses EVM in Section 6.5.2 and in Annex E.

According to aspects, the DUT 120 is part of a 3GPP new radio (NR) system, or part of a long term evolution (LTE) system based on 3GPP specification. The DUT 120 may furthermore be arranged to transmit and/or to receive orthogonal frequency division multiplex (OFDM) signals.

Performance of a DUT 120 may herein also refer to DUT characteristics such as radiation diagrams, transmission coefficients, reflection coefficients, and/or S-parameters. Performance of a DUT may furthermore refer to performance on a system level, such as bit error rates (BER), packet error rates (PER) or reliability measurements such as outage. Performance may furthermore refer to standard compliance tests and the like.

Some types of performance measurements, e.g., fading tests where the DUT is subjected to a RIMP environment, or EMC/EMI measurements have traditionally been performed using RCs, and some other types of measurements, e.g., EVM measurements, have traditionally been performed in more frequency flat fading scenarios. It is often desired to perform a series of different measurements in batch mode, or even simultaneously in parallel. This may be a problem using traditional EVM measurement techniques in RCs that generate frequency selective fading.

The measurement device 100 in FIG. 1 comprises a chamber 110 having inwardly radio frequency reflective walls 111 configured to enclose a DUT 120. The measurement equipment also comprises one or more mode stirrers 140, 150 which can be moved in order to generate different fading scenarios inside the chamber 110. A test antenna 130 is configured to transmit and to receive wireless signals 131 to and from the DUT. These signals are herein assumed to be limited to some frequency band of interest.

According to some aspects, a plurality or a set of test antennas are arranged inside the chamber 110. The measurement system may then generate different fading scenarios also by switching between the different antennas.

The DUT 120 is here shown arranged on a turntable 160, which is a displacement mechanism that can be used to modify the geometric relationship between, e.g., the DUT 120 and the test antenna 130. Depending on, e.g., the DUT antenna diagram, maneuvering the displacement mechanism will also generate a different fading scenario as experienced by the DUT.

One or more absorbers 170 can be placed in the chamber 110 to 'load' the chamber. Naturally, the more absorbers the less frequency selective the environment inside the chamber will be. An extreme case is represented by the known anechoic measurement chambers where no multipath propagation, or very little multipath propagation occurs. Thus, absorbers affect the coherence bandwidth of the chamber. The effect of absorbers on an RC is known and will not be discussed in more detail herein.

A control unit 160 is also comprised in the measurement equipment 100 and arranged to perform measurements. The control unit is adapted to, e.g., generate test signals, determine measurement results, and store measurement results. The control unit 160 is also arranged to control the reverberation camber, i.e., to generate different fading scenarios by moving the mode stirrers 140, 150. The control unit will be discussed in more detail below in connection to FIG. 5.

The chamber 110 and the measurement equipment is, in general, similar to known reverberation chambers configured to generate a radio frequency reflective environment. The measurement equipment 100 illustrated in FIG. 1 will therefore not be discussed in more detail herein.

Figure 2:
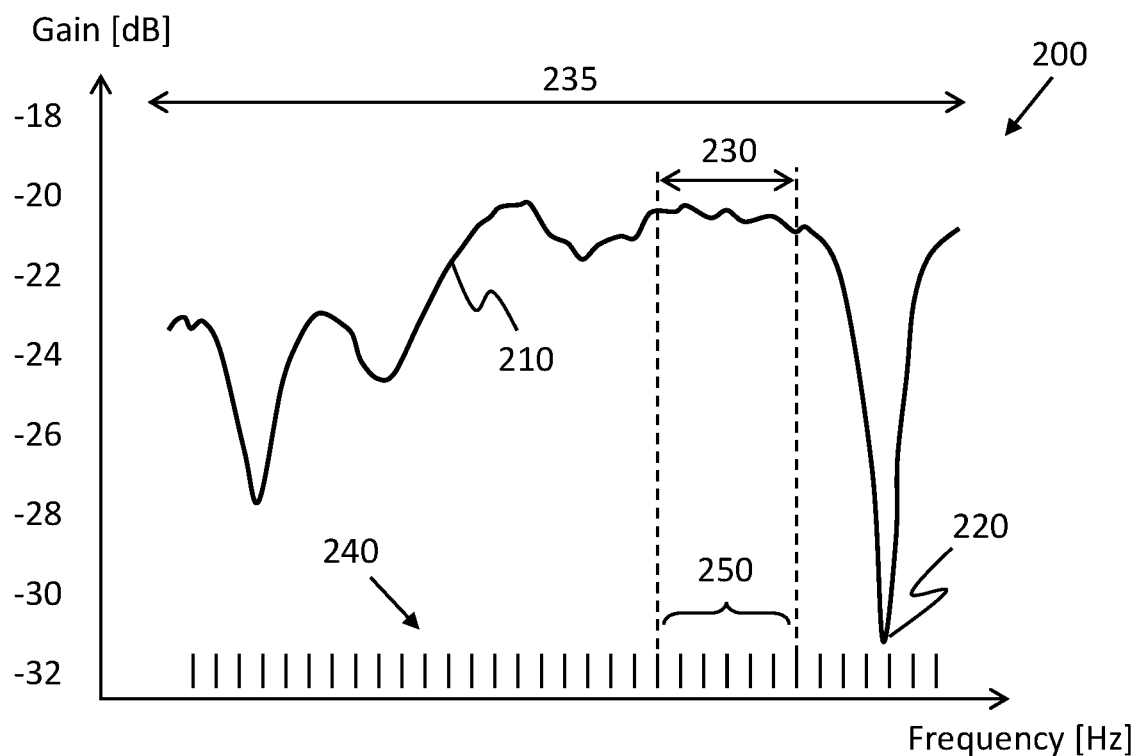
FIG. 2 is a graph showing channel gain as function of frequency.

FIG. 2 shows a graph 200 of channel gain 210 in dB on the link 131 between the test antenna 130 and the DUT 120 as function of frequency in Hz. The gain varies over frequency due to the reflective environment in the chamber 110 in a known stochastic manner. The location and general shape of the gain curve 210 is at least in part determined by the position of the mode stirrers 140, 150 and potentially also by the displacement mechanism 160. If any of these are moved, then the gain curve 210 changes shape, i.e., the notches 220 move in gain and frequency and there may appear essentially flat portions 230 where the frequency response does not show any significant variation.

Orthogonal frequency division multiplexing (OFDM) is a modulation scheme that is popular in many wireless systems, such as that discussed in 3GPP TS 36.104 V16.1.0. OFDM uses subcarriers of relatively narrow bandwidth to convey information in time slots. A group of subcarriers used for communication over a time window is referred to as a resource block (RB). FIG. 2 schematically illustrates the subcarriers 240 of an example OFDM system. Notably, some of the subcarriers 250 are comprised in the sub-band 230 exhibiting more flat gain curve characteristics.

According to an example, the DUT 120 is an OFDM-based radio transmission unit. The DUT may be specified according to 3GPP radio requirements, or according to IEEE 802.11 Wi-Fi radio requirements, or the like.

In fading conditions, the signal 131 from the test object or DUT 120 will be attenuated or amplified depending on the relative phase of the reflected signals inside the chamber 110, and in portions of the spectrum the resulting signal will be close to the original signal, like in the sub-band 230. How frequent the deeper fading dips 220 occur depends, e.g., on the size of the used chamber 110, and how much absorbers 170 that are placed in the chamber 110.

A general idea presented herein is to find the frequency sub-bands with fairly flat spectrum for different mode stirrer positions during contiguous or stepped fading and, by piecing together different parts of the spectrum from different chamber configurations, generate a result based on all, or at least a majority, of the RB's. This will be possible since the frequency position of the fading dips and flat sub-bands change as the mode stirrers are moved. Thus, eventually, all RBs or at least a majority of the RBs can be measured in flat conditions.

Figure 3:
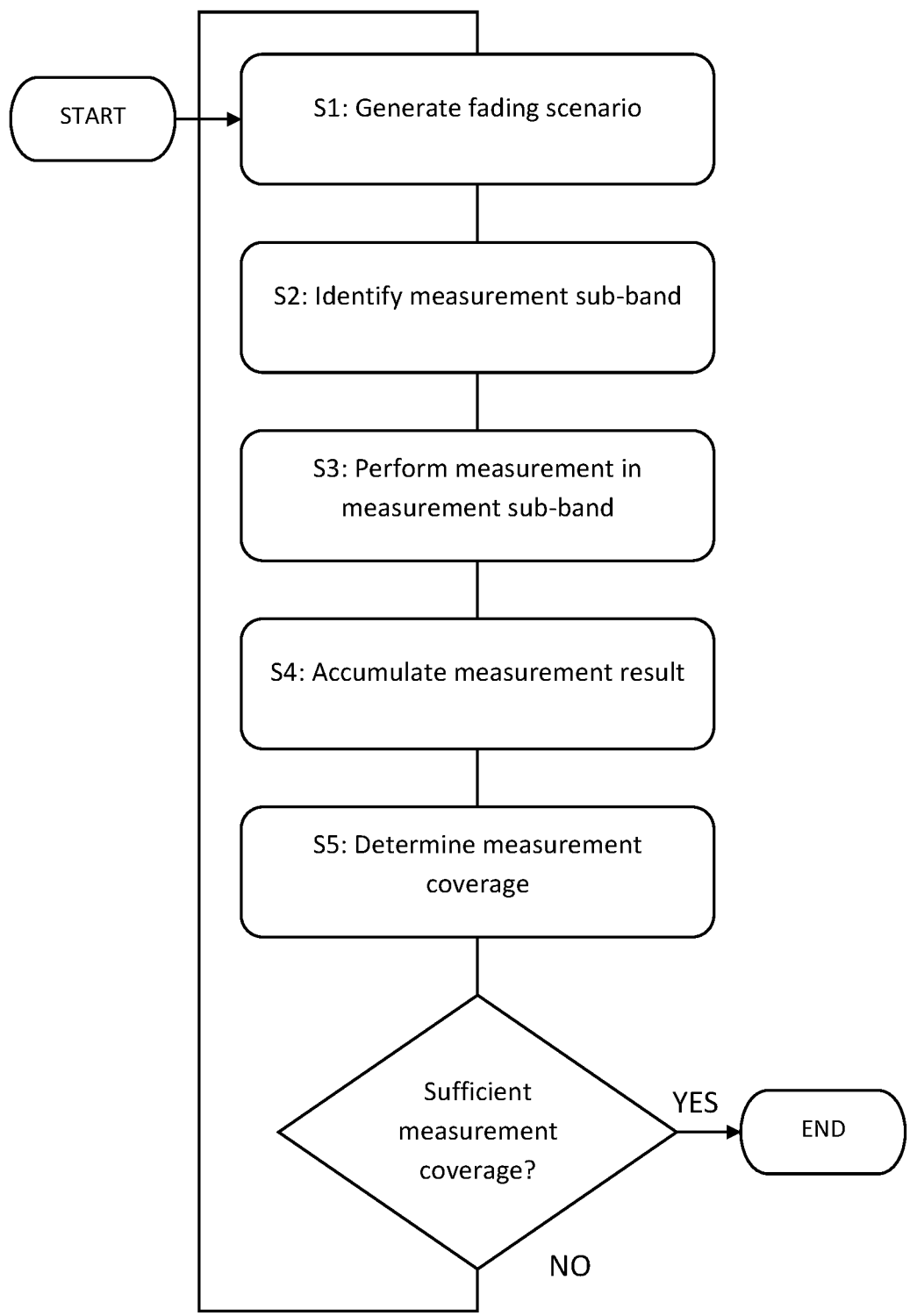
FIG. 3 is a flow chart illustrating a conceptual method.

FIG. 3 shows a flow chart which illustrates this general idea for performing measurements of, e.g., EVM. The method starts by generating S1 a fading scenario inside the chamber 110 by configuring the mode stirrers in some deterministic position or by applying a random configuration. The resulting fading pattern is then analyzed in order to determine suitable sub-bands for performing measurement. These sub-bands are comparably flat, i.e., the sub-bands show a gain characteristic which resembles that of a conducted measurement or a measurement inside an anechoic chamber. Measurements are then performed on the sub-band S3, and the measurement results are accumulated S4. Based on the measurement sub-bands covered so far, it is determined if a sufficient measurement coverage has been obtained S5, i.e., if the measurement procedure can be terminated. Exactly what constitutes a sufficient measurement coverage is defined for each measurement campaign depending on requirements. Some measurements may require a total coverage, i.e., that the entire frequency band of interest has been measured at least once. Other less strict measurements may only require that, e.g., a percentage of the frequency band of interest is covered. The percentage can be, e.g., 80% or 90% of the total frequency bandwidth of interest.

Some aspects of the disclosed methods are based on performing an IQ-capture of the signal 131 in accordance with standard EVM measurement techniques, e.g., as described in 3GPP TS 36.104 V16.1.0. An IQ-capture relates to sampling a section of the wireless signal 131 and storing the section as complex numbers, i.e., In-phase and Quadrature components. This signal can be related to a signal constellation as discussed above, and EVM can be measured. The spectral information of the IQ-capture can, through an FFT or the like, be analyzed to determine what frequency band portions of the signal that has a limited fading impact. Based on where in the spectrum the signal appears to be "flat" enough, the resource blocks in that region are selected for EVM measurement. IQ data and the sampling of baseband signals are known and will not be discussed in more detail herein.

A total calculated EVM can be obtained by accumulating measurement results for a number of different fading scenarios, i.e., for a number of different mode stirrer positions.

A weighted averaging of the EVM measurement results can optionally also be used as the fractional EVM result for each capture is stored at RB-level, hence a result that is based on many resource blocks in the IQ-capture (thus often more accurate) will have a larger impact on the final result than a measurement based on a more limited number of RB's (thus often less accurate).

Each EVM measurement can also be adjusted for gain level to account for differences in gain between the different flat portions in the identified measurement sub-bands.

An example EVM measurement technique will now be described with reference to 3GPP TS 36.104 V16.1.0. EVM measurements according to 3GPP TS 36.104 V16.1.0 shall be performed with an implementation of an equalizer of the frequency domain data in the measurement. The equalizer coefficients for amplitude and phase and at the reference signal subcarriers are obtained by computing a moving average in the frequency domain of the time-averaged reference signal subcarriers, i.e., every third subcarrier. The moving average window size is 19. For reference subcarriers at or near the edge of the channel the window size is reduced accordingly.

A subcarrier can be either 15 kHz or 7.5 kHz, and a resource block consists of 12 or 24 subcarriers. In the case of a 20 MHz Long Term Evolution (LTE) signal each RB is 12 subcarriers wide. The total signal in this case is 100 RB.

The moving average operation is performed such that the first subcarrier is not averaged, the second is the average of the first three and so on until the tenth subcarrier and onwards where the window size is 19 until the upper edge of the channel is reached and the window size reduces back to 1. This is of course beneficial in a conducted environment, where the signal is fairly flat in the frequency domain, and a wide window will, by increased averaging decrease the receiver noise. However, in a heavily faded environment this will mean that the impact of fading in the spectrum impact the neighboring subcarriers in the equalization process—the equalizer is not applicable outside the coherence bandwidth of the channel. Proper EVM measurement is thus not possible.

If the equalizer instead only uses up to e.g. a window size of 7 the resulting equalized spectrum will come closer to the un-equalized spectrum, meaning that the impact of fading is limited to the next three subcarriers.

The selection of what RB to use in the analysis is performed on the spectrum of the IQ signal after the equalizer operation. According to an example, parts of the frequency spectrum that is within 1-2 dB of the selected level is used for EVM measurement.

Based on the appearance of the spectrum, the most common level closest to the peak signal is selected, and if a high enough number of RB are covered by this selection, EVM analysis is performed on those RB's. The method keeps track of what RB's that have already been analyzed in order to determine when enough of the spectrum is covered.

For tests without any absorbers 170 in the chamber 110, it may be beneficial to decrease the required number of RB for each capture, as the spectrum has virtually no flat portions. A number of IQ captures are processed, until a required number of flat enough portions have been identified throughout the frequency band of interest, or at a defined percentage of the spectrum. As the fading dips with high probability occur at different frequencies for every IQ-capture, the test time is determined by the probability of finding flat enough portions on frequencies previously not measured. Therefore, 100% RB's can take substantially longer time to identify compared to, e.g., 80%.

The possibility to perform a calibration of the RC impact on the EVM measurement results in order to remove the added measurement error from frequency selective fading and to achieve a result even closer to a conducted measurement can be considered as an option. This calibration may be based on a fairly long time measurement signal capture in order to ensure that enough mode stirrer positions are covered. It is also possible to perform a calculation of the added uncertainty based on the best achievable result with a known signal. As the added error is uncorrelated to the EVM in the signal, the total error variance can be obtained as $$\sigma_{total} = \sqrt{\sigma_{DUT}^2 + \sigma_{chamber}^2}$$

This means that the contribution from the chamber is $$\sigma_{chamber} = \sqrt{\sigma_{total}^2 - \sigma_{DUT}^2}$$

The measurement results during measurements can only be compensated for the chamber, as we have no possibility to separate the EVM caused by the generation and the analysis. This means that for measurements we could use:

$$\sigma_{DUT} = \sqrt{\sigma_{measured}^w - \sigma_{chamber}^2}$$

The measurement of the chamber uncertainty can be estimated in any way available to the user, e.g. by repeated measurements on a DUT or by analytical calculations derived from the coherence bandwidth.

Performing measurements limited to, e.g., 80% of the covered resource blocks has a large impact on the measurement time but may potentially lead to erroneous measurement results in case there is some frequency limited impairment (e.g. a very high power spurious in the modulation) why 100% RB's would be recommended at least for verification purposes. In most situations, an 80% minimum limit on the number of resource blocks would however yield in an accurate result with a substantially shorter test time as result.

Figure 4:
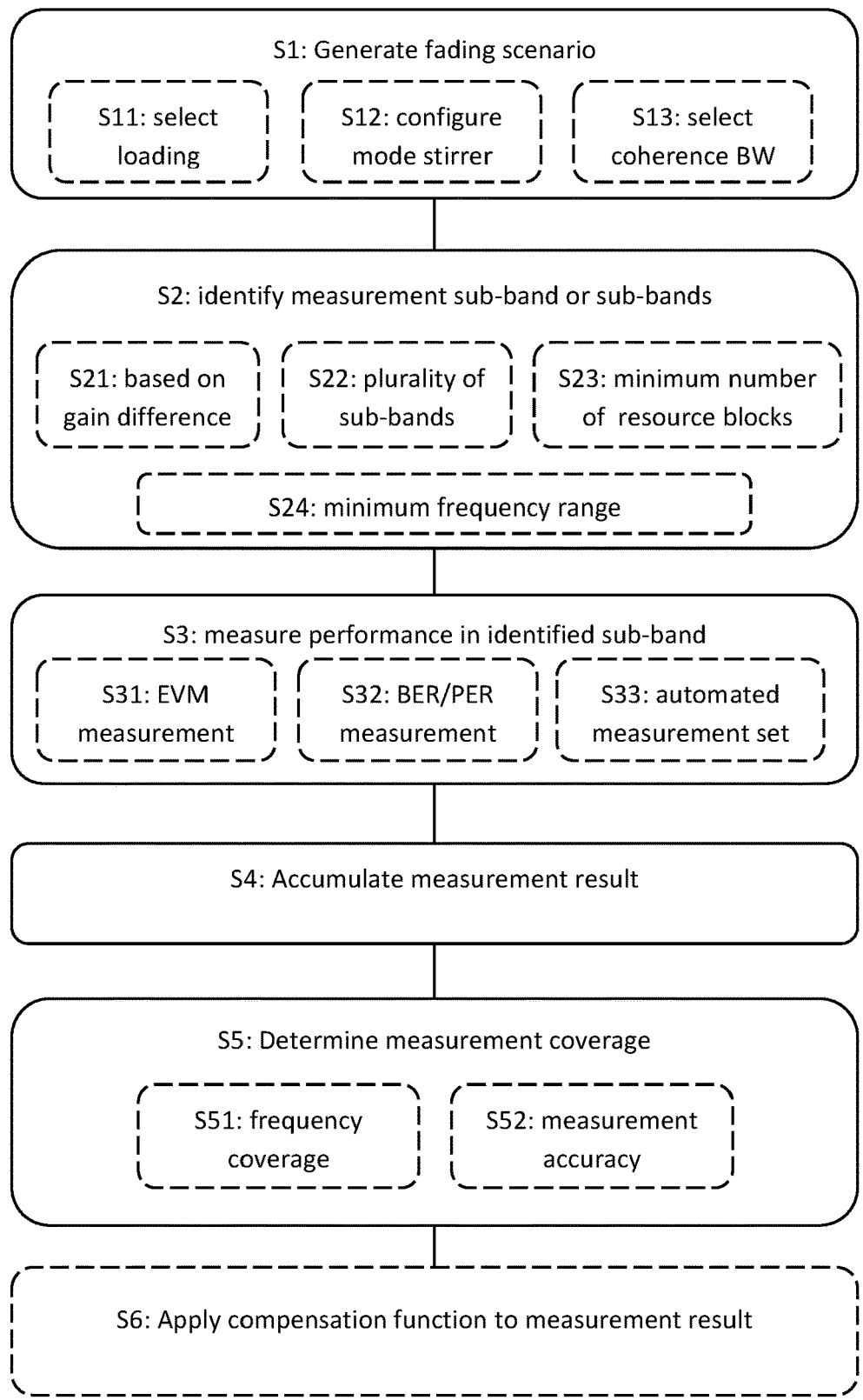
FIG. 4 is a flow chart illustrating details of example methods.

FIG. 4 is a flow chart illustrating methods corresponding to the above discussions. There is illustrated a method for measuring performance of at least one DUT 120 in a reverberation chamber 110 over a frequency band 235. The method is an iterative method which iterates a sequence of operations until a termination condition has been fulfilled, or until a pre-determined number of iterations have been executed. The order of the operations shown in FIG. 4 is not necessarily the order in which operations are performed, other operation orderings are certainly possible. Also, some operations need not be performed every iteration. For instance, the termination criterion may not need to be evaluated every iteration, as will be realized by the skilled person.

The method comprises generating S1 a fading scenario by the reverberation chamber 110. A fading scenario is a realization of the RIMP environment inside the chamber, i.e., a gain curve with notches, dips, and possibly also more flat parts as illustrated in FIG. 2. A fading scenario can be generated by, e.g., shifting a mode stirrer 140, 150, or by maneuvering the turntable 160, or by switching between a plurality of test antennas. In other words, according to aspects, generating a fading scenario comprises configuring S12 a geometry of a mode stirrer or a displacement mechanism such as a turntable 160 inside the reverberation chamber 110.

The control unit 160 may be adapted to automatically step through a sequence of fading scenarios, either randomly or according to some deterministic chamber configuration sequence. An advantage associated with using a deterministic chamber configuration sequence is that some level of repeatability may be obtained.

According to some aspects, a loading of the reverberation chamber 110 may optionally be selected S11. The loading may, e.g., comprise inserting one or more absorbers 170 into the chamber 110. The more absorbers the flatter the frequency gain curve 200 will be. However, a too flat gain curve may be unsuitable for other types of performance measurements, which is why a trade-off may be necessary.

According to some other aspects, generating a fading scenario comprises selecting S13 a coherence bandwidth of the reverberation chamber 110. This selection can be by experimentation with different loadings and mode stirrer configurations, or it can be read out from a list of chamber configurations giving certain coherence bandwidths.

Given the generated fading scenario, the method then comprises identifying S2 at least one measurement sub-band 230 comprised in the frequency band 235, wherein the at least one measurement sub-band complies with a gain flatness criterion. More than one measurement sub-band S22 may of course be identified in each iteration. It is also appreciated that for some iterations no measurement sub-band may be identified, in which case a new fading realization may be generated. Gain flatness can be measured in a number of different ways, and it is appreciated that the disclosed methods can be used with a wide variety of gain flatness criteria. Many suitable gain flatness criteria comprise some type of gain difference measure S21 across the measurement sub-band. For instance, the difference between maximum and minimum gain across the measurement sub-band candidate may be required to be below say 1-2 dB. A measure of variance or standard deviation can also be used to define a flatness criterion.

One method of finding suitable measurement sub-bands is to start at some peak gain location and extend a frequency window in some frequency direction while monitoring the flatness criterion. The frequency window is then extended until the gain flatness criterion is no longer fulfilled.

Minimum limits on the identified measurement sub-bands may optionally be imposed. Thus, according to some aspects, a measurement sub-band is identified only if the measurement sub-band spans over a minimum number of resource blocks S23. According to some other aspects a measurement sub-band is identified only if the measurement sub-band spans over a minimum frequency range S24.

Given at least one identified measurement sub-band 230, the method comprises measuring S3 performance of the at least one DUT 120 in the at least one identified measurement sub-band, thereby generating at least one performance measurement result.

The type of measurement made may differ. However, the disclosed methods are particularly suitable for use with any of error vector magnitude (EVM) measurements S31, bit-error-rate (BER), or packet-error-rate (PER) measurements S32, which may be associated with requirements that assume a flat fading test scenario.

Optionally, the performance measurement is part of an automated set of measurements S33.

Any measurement results from the measurement operation are then accumulated, i.e., the method comprises accumulating S4 the at least one performance measurement result. Over time, as the method iterates, more and more measurement results will be obtained. With high probability, measurement sub-bands will be identified at different places in the frequency band of interest. Thus, eventually, most or all of the frequency band of interest is covered by at least one measurement sub-band.

The method comprises determining S5 measurement coverage and terminating the performance measurement in case the measurement coverage meets a coverage criterion. The coverage criterion can be selected based on application. If accuracy is of the utmost importance, a strict coverage criterion can be used, e.g., that the measurement sub-bands must together account for the entire frequency band of interest. However, if measurement time is more important than accuracy, the coverage criterion can be relaxed.

According to some aspects, the measurement coverage is determined based on frequency range coverage S51, e.g., a percentage of the frequency band of interest which must be covered by at least one measurement sub-band. A suitable value for this percentage may be 80% or 90%.

According to some other aspects, the measurement coverage is determined based on estimated measurement accuracy S52. Measurement accuracy can be determined, e.g., based on fluctuation in the measured values. When the measurements after accumulation appears to have settled, the measurement may be terminated.

Optionally, the method comprises applying a compensation function to the accumulated measurement result S6. This compensation function may compensate for different measurement effects. For instance, measurements in parts of the frequency band of interest which have been covered by many measurement sub-bands may be weighted more heavily in the final measurement result compared to frequency ranges which have only sparsely been covered.

Figure 5:
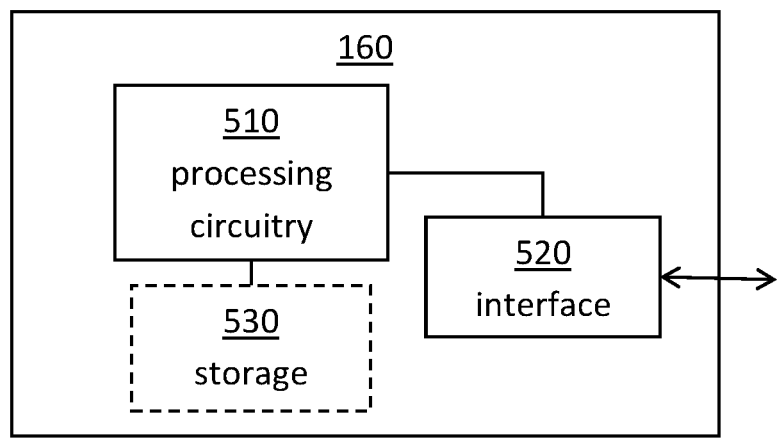
FIG. 5 schematically illustrates a control unit.

FIG. 5 schematically illustrates, in terms of a number of functional units, the components of the control unit 160 according to an embodiment of the discussions herein. Processing circuitry 510 is provided using any combination of one or more of a suitable central processing unit CPU, multiprocessor, microcontroller, digital signal processor DSP, etc., capable of executing software instructions stored in a computer program product, e.g. in the form of a storage medium 530. The processing circuitry 510 may further be provided as at least one application specific integrated circuit ASIC, or field programmable gate array FPGA.

Particularly, the processing circuitry 510 is configured to cause the control unit 160 to perform a set of operations, or steps, such as the methods discussed in connection to FIG. 4. For example, the storage medium 530 may store the set of operations, and the processing circuitry 510 may be configured to retrieve the set of operations from the storage medium 530 to cause the control unit 160 to perform the set of operations. The set of operations may be provided as a set of executable instructions. Thus, the processing circuitry 510 is thereby arranged to execute methods as herein disclosed.

The storage medium 530 may also comprise persistent storage, which, for example, can be any single one or combination of magnetic memory, optical memory, solid state memory or even remotely mounted memory.

The control unit 160 may further comprise an interface 520 for communications with at least one external device, such as the test antenna arrangement 130 and the at least one DUT 120. As such the interface 520 may comprise one or more transmitters and receivers, comprising analogue and digital components and a suitable number ports for wireline or wireless communication.

The processing circuitry 510 controls the general operation of the control unit 160 e.g. by sending data and control signals to the interface 520 and the storage medium 530, by receiving data and reports from the interface 520, and by retrieving data and instructions from the storage medium 530. Other components, as well as the related functionality, of the control node are omitted in order not to obscure the concepts presented herein.

A central function of the control unit 160 is to transmit test signals 131 via the interface 520 to, e.g., the test antenna arrangement 130 or to the at least one DUT 120. A test signal 131 may, e.g., comprise control signaling and data signals. The test signal may be a baseband signal, or a radio frequency signal.

The control unit may also be configured to control operation of the displacement unit 160, i.e., the turntable, according to a pre-determined pattern of displacement, or adaptively in response to some feedback signal.

The different control programs that the control unit executes can be stored in the storage medium 530.

In summary, there is disclosed herein a control unit 160 for measuring performance of at least one DUT 120 in a reverberation chamber 110 over a frequency band 235. The control unit comprises processing circuitry 510 and an interface 520 configured to, iteratively;

generate a fading scenario by the reverberation chamber 110, identify at least one measurement sub-band 230 comprised in the frequency band 235, wherein the at least one measurement sub-band complies with a gain flatness criterion, measure performance of the at least one DUT 120 in the at least one identified measurement sub-band, thereby generating at least one performance measurement result, accumulate the at least one performance measurement result, and determine measurement coverage and terminating the performance measurement in case the measurement coverage meets a coverage criterion.

There is also disclosed herein a measurement device, such as the measurement device 100 shown in FIG. 1, comprising the control unit 160.

Figure 6:
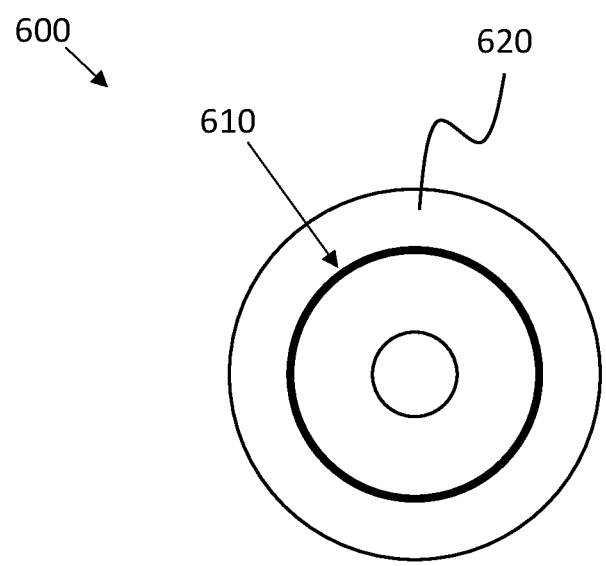
FIG. 6 illustrates a computer program product.

FIG. 6 schematically illustrates a computer program product 600, comprising a set of operations 610 executable by the control unit 160. The set of operations 610 may be loaded into the storage medium 530 in the control unit 160. The set of operations may correspond to the methods discussed above in connection to FIG. 4.

In the example of FIG. 6, the computer program product 600 is illustrated as an optical disc, such as a CD (compact disc) or a DVD (digital versatile disc) or a Blu-Ray disc. The computer program product could also be embodied as a memory, such as a random-access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program is here schematically shown as a track on the depicted optical disk, the computer program can be stored in any way which is suitable for the computer program product.

The invention claimed is:

1. A method for measuring performance of at least one device under test, DUT, (DUT) in a reverberation chamber over a frequency band, the method comprising, iteratively:
generating a fading scenario by the reverberation chamber;
measuring a channel gain across a frequency band on a link between the DUT and a test antenna of the reverberation chamber;
identifying, from said measured channel gain, at least one measurement sub-band comprised in the frequency band, wherein the at least one measurement sub-band complies with a gain flatness criterion, the gain flatness criterion comprising a measure of gain difference across the measurement sub-band;
measuring performance of the at least one DUT in the at least one identified measurement sub-band, thereby generating at least one performance measurement result;
accumulating the at least one performance measurement result; and
determining measurement coverage and terminating the performance measurement in case the measurement coverage meets a coverage criterion.

2. The method according to claim 1, wherein generating a fading scenario comprises any of:
selecting a loading of the reverberation chamber,
configuring a geometry of a mode stirrer or a displacement mechanism, or selecting a test antenna from a set of test antennas, inside the reverberation chamber, and selecting a coherence bandwidth of the reverberation chamber.

3. The method according to claim 1, wherein a plurality of measurement sub-bands can be identified in each iteration.

4. The method according to claim 1, wherein a measurement sub-band is identified when the measurement sub-band spans over a minimum number of resource blocks and/or spans over a minimum frequency range.

5. The method according to claim 1, wherein the measured performance comprises an error vector magnitude (EVM) measurement.

6. The method according to claim 1, wherein the measured performance comprises packet-error-rate measurements.

7. The method according to claim 1, wherein the performance measurement is part of an automated set of measurements.

8. The method according to claim 1, wherein the measurement coverage is determined based on frequency range coverage and/or based on estimated measurement accuracy.

9. The method according to claim 1, wherein the method further comprises, iteratively:
applying a compensation function to the accumulated measurement result.

10. A non-transitory computer-readable medium on which is stored a computer program comprising program code for performing the method of claim 1 when said program is run on a computer or on processing circuitry of a control unit.

11. The method according to claim 2, wherein a plurality of measurement sub-bands can be identified in each iteration.

12. The method according to claim 2, wherein a measurement sub-band is identified when the measurement sub-band spans over a minimum number of resource blocks and/or spans over a minimum frequency range.

13. The method according to claim 3, wherein a measurement sub-band is identified when the measurement sub-band spans over a minimum number of resource blocks and/or spans over a minimum frequency range.

14. A control unit for measuring performance of at least one device under test (DUT) in a reverberation chamber over a frequency band, the control unit comprising processing circuitry and an interface configured to, iteratively:
generate a fading scenario by the reverberation chamber;
measure a channel gain across a frequency band on a link between the DUT and a test antenna of the reverberation chamber;
identify, from said measured channel gain, at least one measurement sub-band comprised in the frequency band, wherein the at least one measurement sub-band complies with a gain flatness criterion, the gain flatness criterion comprising a measure of gain difference across the measurement sub-band;
measure performance of the at least one DUT in the at least one identified measurement sub-band, thereby generating at least one performance measurement result;
accumulate the at least one performance measurement result; and
determine measurement coverage and terminating the performance measurement in case the measurement coverage meets a coverage criterion.

15. The control unit according to claim 14, wherein the control unit is adapted to automatically step through a sequence of fading scenarios.

16. A measurement device comprising the control unit of claim 14.

* * * * *